US009264816B2

(12) United States Patent
Akino

(10) Patent No.: US 9,264,816 B2
(45) Date of Patent: Feb. 16, 2016

(54) VOLUME REDUCTION FILLING MEMBER FOR MICROPHONE AND UNIDIRECTIONAL CONDENSER MICROPHONE INCORPORATING THE SAME

(71) Applicant: KABUSHIKI KAISHA AUDIO-TECHNICA, Machida-shi, Tokyo (JP)

(72) Inventor: Hiroshi Akino, Machida (JP)

(73) Assignee: KABUSHIKI KAISHA AUDIO-TECHNICA, Machida-Shi, Tokyo (JP)

( * ) Notice: Subject to any disclaimer, the term of this patent is extended or adjusted under 35 U.S.C. 154(b) by 43 days.

(21) Appl. No.: 14/479,968

(22) Filed: Sep. 8, 2014

(65) Prior Publication Data

US 2015/0181320 A1 Jun. 25, 2015

(30) Foreign Application Priority Data

Dec. 25, 2013 (JP) ................................ 2013-267342

(51) Int. Cl.
*H03G 3/00* (2006.01)
*H04R 19/04* (2006.01)
*H04R 3/00* (2006.01)

(52) U.S. Cl.
CPC ..................................... *H04R 19/04* (2013.01)

(58) Field of Classification Search
CPC ............. H04R 3/00; H04R 1/08; H04R 19/04
USPC ......... 381/111, 113, 104, 355, 356, 361, 363, 381/369, 174; 704/233
See application file for complete search history.

(56) References Cited

U.S. PATENT DOCUMENTS

2014/0003628 A1* 1/2014 Akino ...................... H04R 3/00
381/104

FOREIGN PATENT DOCUMENTS

JP 2011-009807 A 1/2011

* cited by examiner

*Primary Examiner* — Vivian Chin
*Assistant Examiner* — Ammar Hamid
(74) *Attorney, Agent, or Firm* — Manabu Kanesaka

(57) ABSTRACT

A microphone includes a volume reduction filling member therein. The volume reduction filling member includes an elastic body having an insertion hole for inserting an electrode extraction member which extracts a generated current to a back end side by contacting a front end side thereof to a fixed electrode of a microphone unit, and reducing a volume inside a unit case. The elastic body is divided into a tip-side main body portion and a base-end-side flexible flange portion through a circular groove around the insertion hole from an outer peripheral face side of a base end portion thereof. When an outer peripheral edge portion of the base-end-side flexible flange portion receives an equal pressure toward a tip direction so as to bend, the elastic body concentrates a stress into a front portion side of the insertion hole through the tip-side main body portion.

5 Claims, 4 Drawing Sheets

Fig. 3(a) Prior Art
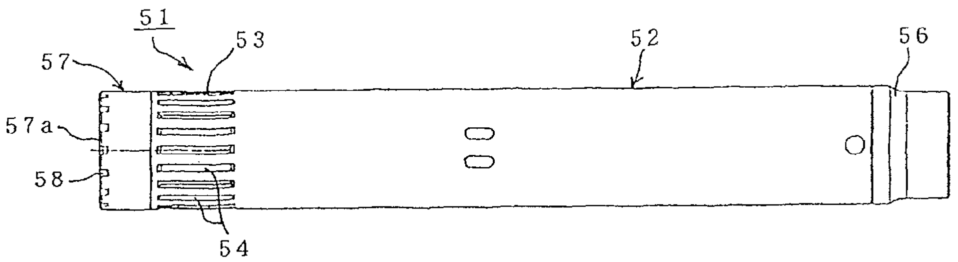
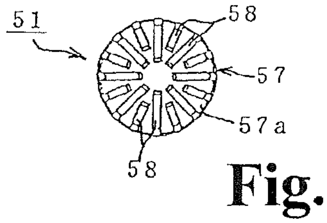
Fig. 3(b) Prior Art
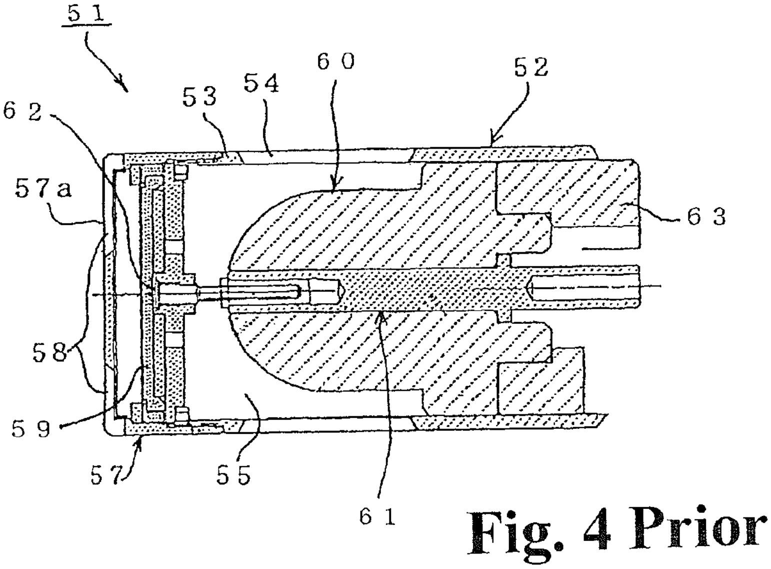
Fig. 4 Prior Art

VOLUME REDUCTION FILLING MEMBER FOR MICROPHONE AND UNIDIRECTIONAL CONDENSER MICROPHONE INCORPORATING THE SAME

BACKGROUND OF THE INVENTION AND RELATED ART STATEMENT

The present invention relates to a volume reduction filling member for a microphone for preventing a generation of a cavity resonance of a unidirectional condenser microphone, and a unidirectional condenser microphone incorporating the same.

Generally, a condenser microphone unit is formed by a unit case whose one face includes a front acoustic terminal as a sound introduction hole and is closed, whereas a female screw is incised on an inner periphery face of an open end portion dividing the other open face. In an order starting from a front acoustic terminal side inside the unit case toward the open end portion, a diaphragm ring including a diaphragm; a spacer ring; and a fixed electrode and an insulating seat relative to the diaphragm are housed. A lock ring is screwed through a male screw screwed into the female screw on a back face of the insulating seat, so that the fixed electrode can be pressed and fixed to a diaphragm ring side through the insulating seat with a predetermined pressure.

FIG. 3(*a*) and FIG. 3(*b*) are explanatory drawings showing one example of a unidirectional cylindrical condenser microphone formed by housing the conventional condenser microphone unit as mentioned above inside a cylindrical body, wherein FIG. 3(*a*) shows a right side view, and FIG. 3(*b*) shows a front view, respectively.

According to the aforementioned figures, a unidirectional condenser microphone 51 is formed by a microphone cylindrical body 52 including rear acoustic terminals 54 on a peripheral face of a front end portion 53 thereof; and a condenser microphone unit 57 including front acoustic terminals 58 on a tip face 57*a* and screwed and disposed on a front end side of the microphone cylindrical body 52.

Also, inside the microphone cylindrical body 52, there is disposed a circuit substrate (not shown in the figures) electrically connected to an output connector portion housed and disposed on a back end portion 56 side thereof in a state wherein a tip portion side thereof is held by a holding member.

Namely, inside the cylindrical body 52, a space for housing and disposing an electronic circuit member including the circuit substrate is required. As a result, after the electronic circuit member and the circuit substrate are disposed at predetermined positions, at portions where the rear acoustic terminals 54 are positioned, there remain a cavity communicating with outside air through the rear acoustic terminals 54.

Then, the cavity operates as an acoustic capacity, so that in the rear acoustic terminal 54, there is an acoustic mass. Therefore, a resonance is generated so as to have a problem of deteriorating a directional frequency response.

FIG. 4 depicts FIG. 1(*a*) in Japanese Patent Application Publication No. 2011-9807 proposed in order to solve the problem mentioned above. Inside a cavity 55 of the microphone cylindrical body 52 in the unidirectional condenser microphone 51, there is disposed a volume reduction filling member 60 for a microphone. Also, the volume reduction filling member 60 for a microphone is supported in a holding member 63. In a center axis direction of the volume reduction filling member 60 for a microphone, there is fixed and disposed an electrode extraction member 61. The electrode extraction member 61 presses a fixed electrode 59 side forming the condenser microphone unit 57. The volume reduction filling member 60 for a microphone is housed and disposed inside the cavity 55 in order to reduce a volume of the microphone cylindrical body 52 so as to raise a resonance frequency to a high frequency. Incidentally, in front (a left side of FIG. 4) of the fixed electrode 59, there is attached a diaphragm ring including a spacer ring and a diaphragm, which faces the fixed electrode 59 (not shown in the figure). The fixed electrode 59 and the diaphragm are disposed at a predetermined interval.

However, the volume reduction filling member 60 for a microphone shown in Japanese Patent Application Publication No. 2011-9807 is formed by a hard plastic sintered porous body. Therefore, in the conventional unidirectional condenser microphone, there is an inconvenience that it is difficult to concentrate a stress in such a way as to uniformly press a unit component member side against an opposite center portion 62.

In view of the aforementioned problem of a conventional technology, the present invention has an object of providing a volume reduction filling member for a microphone which can uniformly press by concentrating the stress on a fixed electrode side while preventing the generation of the cavity resonance of the unidirectional condenser microphone. Moreover, the present invention has an object of providing a unidirectional condenser microphone unit incorporating the volume reduction filling member for a microphone.

Further objects and advantages of the invention will be apparent from the following description of the invention.

SUMMARY OF THE INVENTION

The present invention is made in order to attain the aforementioned objects, and main characteristics of the first aspect of the invention (a volume reduction filling member for a microphone) is that the volume reduction filling member for a microphone comprises an elastic body including an insertion hole for inserting and disposing an electrode extraction member which extracts a generated current to a back end side by contacting a front end side thereof in a center axis direction of a fixed electrode forming a unit built-in member inside a unit case in a condenser microphone unit detachably screwed and disposed in a front end portion of a microphone cylindrical body, and volume-reducibly disposed inside the unit case together with the electrode extraction member; that the elastic body is divided into a tip-side main body portion and a base-end-side flexible flange portion by a circular groove having an equal width and depth around an axis direction orthogonal to a length direction of the insertion hole from an outer peripheral face side of a base end portion thereof; and that when an outer peripheral edge portion of the base-end-side flexible flange portion receives an equal pressure toward a tip direction so as to bend, the elastic body is formed so as to concentrate a stress into a front portion side of the insertion hole through the tip-side main body portion.

In a second aspect, preferably, the insertion hole has a diameter expansion portion engaging with a large diameter portion that the electrode extraction member provides, and controlling a movement thereof on the front portion side.

Also, the main characteristics of a third aspect of the invention (a unidirectional condenser microphone) is that the unidirectional condenser microphone comprises a microphone cylindrical body incorporating an electronic circuit member; and a condenser microphone unit detachably attached to a front end portion of the microphone cylindrical body through a unit case including a front acoustic terminal on a tip face, and a rear acoustic terminal on a peripheral face of a front end portion. Also, in the unidirectional condenser microphone, an internal capacity of a cavity ensured inside the unit case is reduced by the volume reduction filling member for a microphone supported through the support ring connecting the unit case and the microphone cylindrical body. As for the volume reduction filling member for a microphone, the elastic body according to the first or second aspect is used, and in the elastic body, the electrode extraction member, which extracts a generated current to a back end side by contacting a front end side thereof in a center axis direction of the fixed electrode housed inside the unit case and forming a unit built-in member, is inserted into the insertion hole so as to be housed and disposed inside the unit case, so that when the outer peripheral edge portion of the base-end-side flexible flange portion receives an equal pressure from the support ring so as to bend, the stress concentrates into the front end of the electrode extraction member through the insertion hole on a tip-side main body portion so as to uniformly and stably press relative to the unit built-in member including the fixed electrode contacting with the front end.

In a fourth aspect, preferably, the support ring is formed by including an annular concave portion in which the outer peripheral edge portion can be fitted at an abutment portion against the outer peripheral edge portion of the flexible flange portion.

According to the first aspect of the invention (the volume reduction filling member for a microphone), the elastic body is divided into the tip-side main body portion and the base-end-side flexible flange portion through the circular groove having the equal width and depth around the axis direction orthogonal to the length direction of the insertion hole from the outer peripheral face side of the base end portion thereof, so that when an equal pressure toward a front end direction is applied to the outer peripheral edge portion of the base-end-side flexible flange portion so as to bend, the stress can be concentrated on the front portion of the insertion hole through the tip-side main body portion.

According to the second aspect of the invention, in the insertion hole, the diameter expansion portion engaging with the large diameter portion that the electrode extraction member provides, and controlling the movement thereof is provided on the front portion side thereof, so that the diameter expansion portion and the large diameter portion are engaged with each other, and the electrode extraction member is stably positioned so as to be inserted and disposed.

According to the third aspect of the invention (the unidirectional condenser microphone), as the volume reduction filling member for the microphone, the elastic body according to the first or second aspect is used, so that in a state wherein the electrode extraction member, which extracts the generated current to the back end side by contacting the front end side thereof in the center axis direction of the fixed electrode, is inserted and disposed through the insertion hole, the electrode extraction member is disposed inside the unit case, and then, when the equal pressure toward the tip direction is applied to the outer peripheral edge portion of the base-end-side flexible flange portion by the support ring so as to bend a base-end-side flexible flange portion side, the stress can be concentrated on the front end of the electrode extraction member, and the pressure can be uniformly and stably applied relative to a unit built-in member including a fixed electrode contacting with the front end, so that an excellent stable performance of unidirectional characteristics can be provided to the condenser microphone unit.

According to the fourth aspect of the invention, in the support ring, the annular concave portion in which the outer peripheral edge portion fits is provided at the abutment portion against the outer peripheral edge portion of the base-end-side flexible flange portion, so that through the annular concave portion, the equal pressure can be applied more reliably relative to a whole periphery of the outer peripheral edge portion of the base-end-side flexible flange portion in the elastic body.

BRIEF DESCRIPTION OF THE DRAWINGS

FIGS. 3(*a*) and 3(*b*) are explanatory drawings showing an example of a general external configuration of the unidirectional condenser microphone including the present invention, wherein FIG. 3(*a*) shows a right side view, and FIG. 3(*b*) shows a front view, respectively;

FIG. 4 is a drawing of FIG. 1(*a*) in Japanese Patent Application Publication No. 2011-9807;

DETAILED DESCRIPTION OF PREFERRED EMBODIMENTS

Figure 1A:
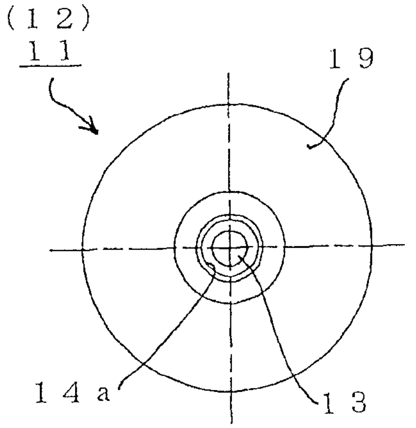
FIGS. 1(*a*) and 1(*b*) are explanatory drawings showing one example of a volume reduction filling member for a microphone according to the first invention, wherein FIG. 1(*a*) shows a front view, and FIG. 1(*b*) shows a right vertical cross-sectional view, respectively.
Figure 1B:
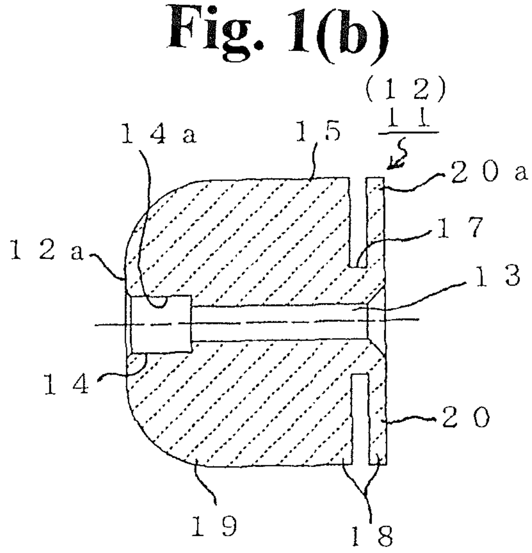
Figure 2A:
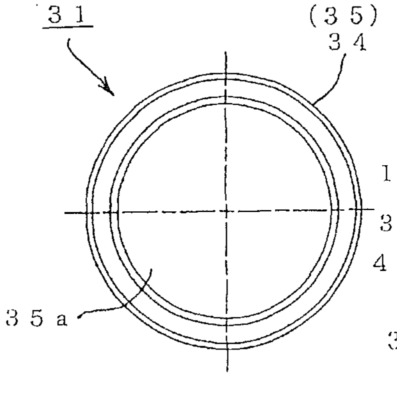
FIGS. 2(*a*) and 2(*b*) are explanatory drawings showing one example of a unidirectional condenser microphone according to a second invention by omitting a part thereof, wherein FIG. 2(*a*) shows a front view, and FIG. 2(*b*) shows a right vertical cross-sectional view, respectively.
Figure 2B:
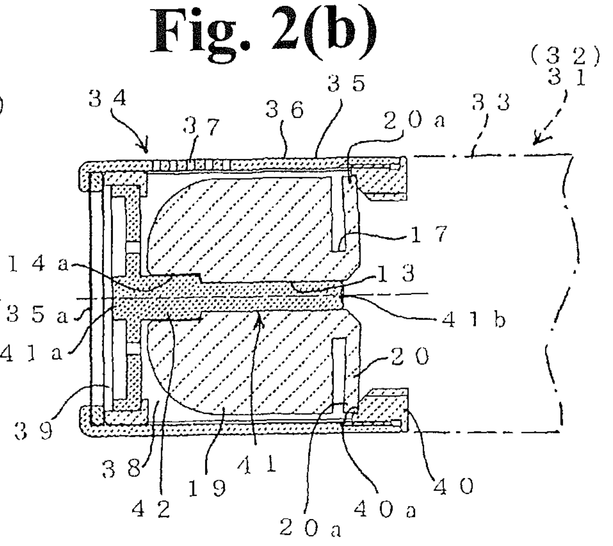

A volume reduction filling member for a microphone according to the first invention shown in FIGS. 1(*a*) and 1(*b*) is implemented by being incorporated in a unidirectional condenser microphone according to a second invention as shown in FIGS. 2(*a*) and 2(*b*). Therefore, embodiments will be explained hereinafter with reference to FIGS. 1(*a*), 1(*b*), 2(*a*), and 2(*b*) while considering FIGS. 3(*a*) and 3(*b*) showing an example of a general external configuration of the unidirectional condenser microphone as well.

A volume reduction filling member 11 for a microphone is disposed inside a cavity 38 of a unit case 35 as shown in FIGS. 2(*a*) and 2(*b*) so as to reduce an internal capacity thereof. The volume reduction filling member 11 for a microphone is formed as an elastic body 12 made of, for example, a silicone rubber and the like.

A condenser microphone unit 34 is detachably screwed and disposed in a front end portion 33 of a microphone cylindrical body 32 through a support ring 40. Inside the unit case 35 of the microphone unit 34, there is disposed an electrode extraction member 41. The electrode extraction member 41 detects a voltage at a back end 41*b* side by contacting a front end 41*a* side with a fixed electrode 39 in a center axis direction of the fixed electrode 39. The elastic body 12 is formed to include an insertion hole 13. The insertion hole 13 is provided for inserting and disposing the electrode extraction member 41.

In that case, the insertion hole 13 is formed to have a diameter expansion portion 14*a* on a front portion 14 side thereof. The diameter expansion portion 14*a* engages a large diameter portion 42 that the electrode extraction member 41 is provided with on the front end 41*a* side. Therefore, through the diameter expansion portion 14*a*, the insertion hole 13 can control a movement of the electrode extraction member 41.

Also, the elastic body 12 is formed to have an appropriate shape and volume such as an approximately column shape whose diameter is, for example, slightly smaller than an inner diameter of the unit case 35, and the like. When the elastic body 12 is disposed inside the cavity 38 of the unit case 35 together with the electrode extraction member 41 inserted and disposed through the insertion hole 13, the elastic body 12 can be substantially reduced according to a desired internal capacity thereof.

Also, the elastic body 12 includes a circular groove 17 having an equal width and depth around an axis direction orthogonal to a length direction of the insertion hole 13 from an outer peripheral face 15 side of a base end portion 18 thereof. The elastic body 12 is formed by being divided into a tip-side main body portion 19 and a base-end-side flexible flange portion 20 through the circular groove 17.

Consequently, as shown in FIGS. 2(*a*) and 2(*b*), an outer peripheral edge portion 20*a* of the base-end-side flexible flange portion 20 receives an equal pressure toward a tip 12*a* direction so as to bend. At that time, the elastic body 12 concentrates a stress on the front portion 14 side of the insertion hole 13 through the tip-side main body portion 19.

The volume reduction filling member 11 may be formed by PPS (Polyphenylene sulfide), i.e. integrally molding PPS. PPS may be, for example, MK124 made by Sumitomo Bakelite Co. Ltd. MK124 shows flex strength of 208 (MPa) and flex elasticity of 12 (Gpa). In the present embodiment, MK124 is used, but it is possible to select other materials according to the requirement of the microphone.

On the other hand, a unidirectional condenser microphone 31 according to the second invention shown in FIGS. 2(*a*) and 2(*b*) is formed by including the microphone cylindrical body 32 incorporating an electronic circuit member which is not shown in the drawings, and the condenser microphone unit 34 detachably attached to a front end portion 33 side of the microphone cylindrical body 32 through the unit case 35. The unit case 35 includes a front acoustic terminal (not shown in the figures) formed in a tip face 35*a*, and a back acoustic terminal 37 formed in a peripheral face 36. Incidentally, the microphone cylindrical body 32 and the condenser microphone unit 34 shown in FIGS. 2(*a*) and 2(*b*) can be integrally connected by the support ring 40 screwed and disposed inside the unit case 35. Outside the support ring 40 and inside the microphone cylindrical body 32, there are formed screw portions in such a way as to be screwed to each other, and the support ring 40 and the microphone cylindrical body 32 can be fitted by turning the support ring 40.

Also, the internal capacity of the cavity 38 retained inside the unit case 35 is substantially reduced by the volume reduction filling member 11 for a microphone supported inside the unit case 35 through the support ring 40.

In that case, as the volume reduction filling member 11 for a microphone, there is used an elastic body according to aspect 1 or 2, i.e., the elastic body 12 divided into the tip-side main body portion 19 and the base-end-side flexible flange portion 20 through the circular groove 17.

Also, the elastic body 12 is housed and disposed inside the unit case 35 by inserting the electrode extraction member 41 into the insertion hole 13. The electrode extraction member 41 detects the voltage at the back end 41*b* side by contacting the front end 41*a* side thereof with the fixed electrode 39 forming a unit built-in member in the center axis direction of the fixed electrode 39.

The outer peripheral edge portion 20*a* of the base-end-side flexible flange portion 20 receives an equal pressure from the support ring 40 so as to bend, so that the stress concentrates into the front end 41*a* side of the electrode extraction member 41 through the insertion hole 13 on a tip-side main body portion 19 side. Therefore, the aforementioned unit built-in member side including the fixed electrode 39 which contacts with the front end 41*a* side can be uniformly and stably pressed. Incidentally, in front (a left side of FIG. 2(*b*)) of the fixed electrode 39, there is attached a diaphragm ring facing the fixed electrode 39 and including a spacer ring and a diaphragm (not shown in the figure). The diaphragm ring is disposed such that the diaphragm faces the fixed electrode 39 at a predetermined interval.

Next, an operation of the present invention comprising the aforementioned structure will be explained. In the elastic body 12 as the volume reduction filling member 11 for a microphone (the first invention), the back end 41*b* side of the electrode extraction member 41 is inserted from the front portion 14 side of the insertion hole 13, so that the electrode extraction member 41 is disposed. In a case wherein the insertion hole 13 includes the diameter expansion portion 14*a* on the front portion 14 thereof, and the electrode extraction member 41 includes the large diameter portion 42 on the front end 41*a* side thereof, respectively, the diameter expansion portion 14*a* and the large diameter portion 42 are engaged with each other, and the electrode extraction member 41 is stably positioned so as to be inserted and disposed.

Thus, the elastic body 12 after the electrode extraction member 41 is inserted and disposed is housed inside the cavity 38 retained inside the unit case 35.

In the unit case 35 after the elastic body 12 is housed, the support ring 40 is disposed and screwed. Thereafter, the support ring 40 is rotated in an extrusion direction, so that the elastic body 12 is positioned and fixed in a state wherein the outer peripheral edge portion 20*a* thereof is bent toward a tip 12*a* side.

Furthermore, when an annular concave portion 40*a* is provided in the support ring 40, the annular concave portion 40*a* and the outer peripheral edge portion 20*a* of the base-end-side flexible flange portion 20 can be fitted to each other. Consequently, a pressure can be uniformly applied at a whole periphery of the peripheral edge portion 20*a*.

Also, the outer peripheral edge portion 20*a* of the base-end-side flexible flange portion 20 is bent so as to concentrate the stress into the front portion 14 side of the insertion hole 13 through the tip-side main body portion 19. Consequently, by using the elastic body 12, the stress can be concentrated into the front end 41*a* side of the electrode extraction member 41 inserted and disposed in the insertion hole 13 as well.

Moreover, the front end 41*a* of the electrode extraction member 41 contacts with the fixed electrode 39 forming the unit built-in member in the center axis direction thereof. Consequently, the pressure can be uniformly and stably applied relative to the unit built-in member side inside the unit case 38.

The elastic body 12 is divided into the tip-side main body portion 19 and the base-end-side flexible flange portion 20 through the circular groove 17 having the equal width and depth around the axis direction orthogonal to the length direction of the insertion hole 13 from the outer peripheral face 15 side of the base end portion 18 thereof. Consequently, according to the first aspect of the invention (the volume reduction filling member for a microphone), a pressure toward the tip 12*a* direction is uniformly applied to the outer peripheral edge portion 20*a* of the base-end-side flexible flange portion 20, and the base-end-side flexible flange portion 20 is bent so as to concentrate the stress into the front portion 14 side of the insertion hole 13 through the tip-side main body portion 19 side.

Also, the diameter expansion portion 14*a*, which engages with the large diameter portion 42 provided in the electrode extraction member 41, and which controls the movement thereof, is provided on the front portion 14 side of the insertion hole 13, so that the diameter expansion portion 14*a* and the large diameter portion 42 are engaged with each other so as to stably position the electrode extraction member 41 and to allow the electrode extraction member 41 to be inserted and disposed.

On the other hand, according to the second aspect of the invention (the unidirectional condenser microphone), relative to the condenser microphone unit 34, excellent unidirectional characteristics can be stably provided. As for the volume reduction filling member 11 for a microphone, the elastic body 12 according to the first and second aspects is used so as to uniformly and stably apply the pressure relative to the unit built-in member side. More specifically, the electrode extraction member 41 detects the voltage at the back end 41*b* by contacting the front end 41*a* side with the elastic body 12 in the center axis direction of the fixed electrode 39. Furthermore, the electrode extraction member 41 is inserted and disposed inside the unit case 35 through the insertion hole 13. By the support ring 40, the pressure toward the tip 12*a* direction is uniformly applied to the outer peripheral edge portion 20*a* of the base-end-side flexible flange portion 20. By that pressure, a base-end-side flexible flange portion 20 side bends, and the stress concentrates on the front end 41*a* side of the electrode extraction member 41. Therefore, the pressure is uniformly and stably applied relative to the unit built-in member side including a fixed electrode 39 side which contacts with the front end 41*a* side.

Furthermore, in the support ring 40, there can be provided the annular concave portion 40*a* fitted in the outer peripheral edge portion 20*a* at an abutment portion against the outer peripheral edge portion 20*a* of the base-end-side flexible flange portion 20. In that case, the pressure can be uniformly applied relative to the whole periphery of the outer peripheral edge portion 20*a* of the base-end-side flexible flange portion 20 in the elastic body 12 more reliably through the annular concave portion 40*a*.

A second embodiment of the invention is explained with reference to FIGS. 5(*a*), 5(*b*) and 6.

The elastic body 12' in the second embodiment includes a tip-side main body portion 19' and the base-end-side flexible flange portion 20' through a circular groove 17' having the equal width and depth, similar to the elastic body 12. However, the tip side main body portion 19' includes a front projection 19*a*' around an insertion hole 13' with a diameter expansion portion 14*a*' slightly longer than that of the first embodiment, and a rear projection 20*a*' is formed at a side opposite to the front projection 19*a*'. Also, the base-end-side flexible flange portion 20' has an annular step 20*b*', and extends radially outwardly beyond the tip-side main portion 19'.

Figure 5B:
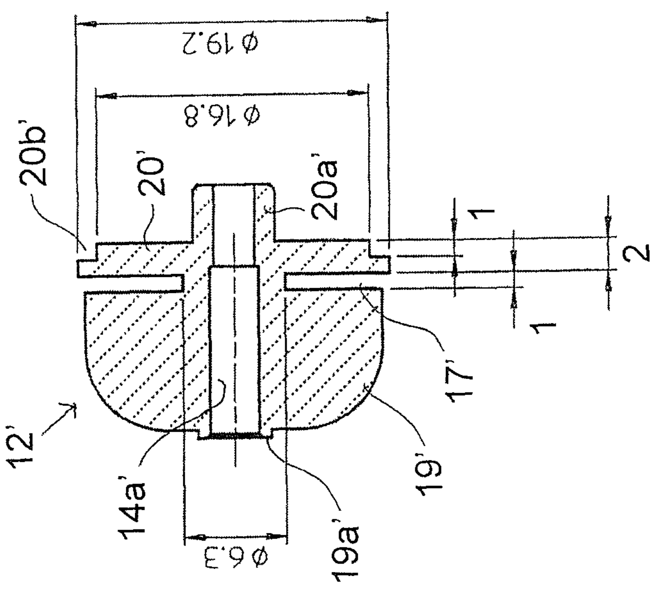
FIGS. 5(*a*) and 5(*b*) are explanatory drawings showing a second example of a volume reduction filling member for a microphone according to the invention, wherein FIG. 5(*a*) shows a front view, and FIG. 5(*b*) shows a right vertical cross-sectional view, respectively.
Figure 5A:
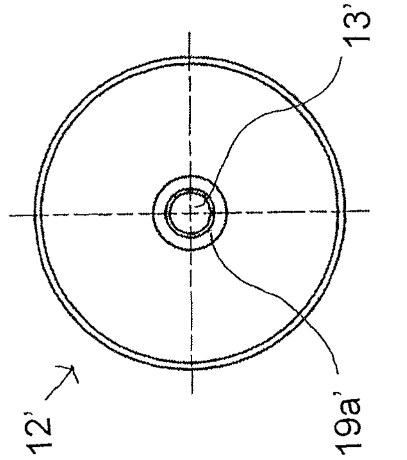

The numerals shown in FIG. 5(*b*) are actual sizes (mm) of the elastic body 12' as examples. The sizes will be changed according to the size of the microphone to be used.

Figure 6:
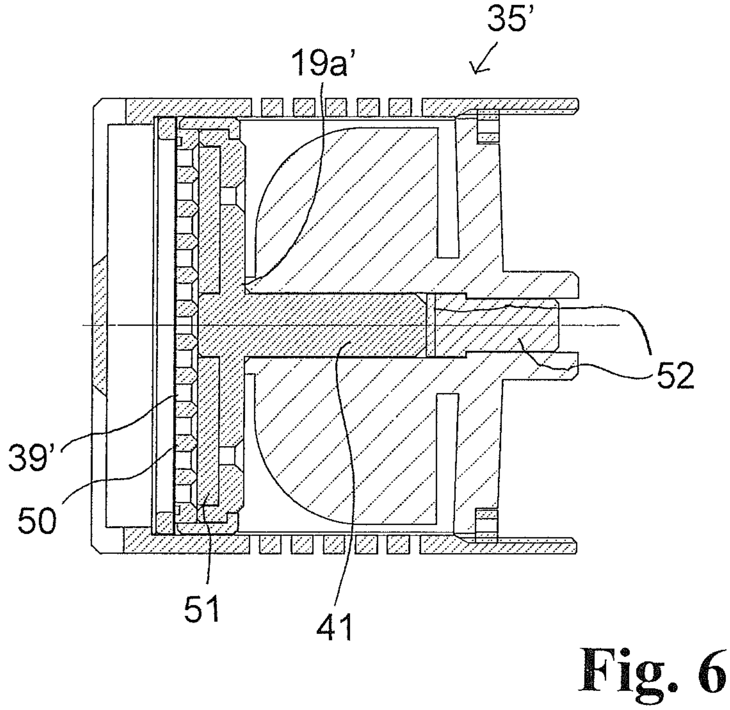
FIG. 6 is a vertical cross-sectional view, similar to FIG. 2(*b*), showing the second example of a unidirectional condenser microphone according to a second invention by omitting a part thereof.

FIG. 6 shows a condition where the elastic body 12' is installed in a unit case 35' of a unidirectional microphone. The elastic body 12' is arranged around the electrode extraction member 41, and is placed behind the fixed electrode 39' through a fixed pole 50 so that the flange portion 20' is pressed to the fixed electrode by a support ring 40'. In this embodiment, a filler 51 is interposed between the fixed pole 50 and the electrode extraction member 41, and two extension members 52 are disposed in the hole behind the electrode extraction member 41. The other structure is the same as that of the first embodiment.

In the embodiment as shown in FIG. 6, the pressure applied by the support ring 40' can be concentrated at the front projection 19*a'*.

According to the first aspect of the invention (the volume reduction filling member for a microphone), a pressure toward the tip 12*a* direction is uniformly applied to the outer peripheral edge portion 20*a* of the base-end-side flexible flange portion 20, and the base-end-side flexible flange portion 20 is bent so as to concentrate the stress into the front portion 14 side of the insertion hole 13 through the tip-side main body portion 19 side.

The second embodiment of the present invention can provide the same effect as in the first embodiment.

Hereinabove, the present invention has been explained based on an illustrated example, and a specific structure thereof is not limited to the example described hereinabove. For example, a cross-sectional shape of the tip-side main body portion 20 in the elastic body 12 is not limited to the illustrated example, and can be appropriately selected provided that the cross-sectional shape has a shape wherein the outer peripheral edge portion 20*a* of the base-end-side flexible flange portion 20 can concentrate the pressure received from the support ring 40 into the tip 12*a* side of the elastic body 12 as the stress.

The disclosure of Japanese Patent Application No. 2013-267342, filed on Dec. 25, 2013, is incorporated in the application.

While the invention has been explained with reference to the specific embodiments of the invention, the explanation is illustrative and the invention is limited only by the appended claims.

What is claimed is:

1. A volume reduction filling member for a microphone, comprising:

an elastic body adapted to be disposed in a unit case of a condenser microphone unit and including an insertion hole extending in a center axis direction thereof, for inserting and disposing an electrode extraction member which extracts a generated current to a back end side, the elastic body reducing a volume inside the unit case together with the electrode extraction member, the elastic body comprising:

a tip-side main body portion, a base-end-side flexible flange portion, and a circular groove dividing the elastic body into the tip-side main body portion and the base-end-side flexible flange portion, the circular groove having an equal width and depth around the insertion hole and extending orthogonal to a length direction of the insertion hole from an outer peripheral face near a base end portion thereof so that when an outer peripheral edge portion of the base-end-side flexible flange portion receives an equal pressure toward a tip direction and bends, a stress is concentrated into a front portion of the tip-side main body portion around the insertion hole.

2. A volume reduction filling member for a microphone according to claim 1, wherein the insertion hole includes a diameter expansion portion at the front portion adapted to engage a large diameter portion of the electrode extraction member to control a movement thereof.

3. A unidirectional condenser microphone, comprising:

a condenser microphone unit including a cylindrical body, a unit case with an acoustic terminal, and an internal capacity in the unit case;

a support ring disposed in the condenser microphone unit and connecting the unit case and the cylindrical body;

a fixed electrode disposed inside the unit case;

an electrode extraction member disposed inside the unit case and contacting the fixed electrode for extracting a generated current to a back end side; and a volume reduction filling member disposed in the internal capacity to reduce a volume inside the unit case together with the electrode extraction member, and comprising an elastic body, said elastic body including:

an insertion hole, extending in a center axis direction, for inserting and disposing the electrode extraction member, a tip-side main body portion, a base-end-side flexible flange portion, and a circular groove dividing the elastic body into the tip-side main body portion and the base-end-side flexible flange portion, the circular groove having an equal width and depth around the insertion hole and extending orthogonal to a length direction of the insertion hole from an outer peripheral face near a base end portion thereof so that when an outer peripheral edge portion of the base-end-side flexible flange portion receives an equal pressure toward a tip direction and bends by the support ring, a stress is concentrated into a front portion around the insertion hole through the tip-side main body portion to uniformly and stably press the fixed electrode contacting with the electrode extraction member.

4. A unidirectional condenser microphone according to claim 3, wherein the support ring includes an annular concave portion in which an outer peripheral edge portion of the base-end-side flexible flange portion is fitted, at an abutment portion against the outer peripheral edge portion of the base-end-side flexible flange portion.

5. A unidirectional condenser microphone according to claim 3, wherein the insertion hole includes a diameter expansion portion at the front portion, and the electrode extraction member includes a large diameter portion disposed in the diameter expansion portion to control a movement thereof.

* * * * *